US009412927B2

(12) United States Patent
Emadi et al.

(10) Patent No.: US 9,412,927 B2
(45) Date of Patent: Aug. 9, 2016

(54) FORMATION OF A THERMOPILE SENSOR UTILIZING CMOS FABRICATION TECHNIQUES

(71) Applicant: Maxim Integrated Products, Inc., San Jose, CA (US)

(72) Inventors: Arvin Emadi, Santa Clara, CA (US); Stanley Barnett, San Francisco, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 14/573,156

(22) Filed: Dec. 17, 2014

(65) Prior Publication Data

US 2015/0325770 A1    Nov. 12, 2015

Related U.S. Application Data

(60) Provisional application No. 61/989,685, filed on May 7, 2014.

(51) Int. Cl.
| | | |
|---|---|---|
| H01L 29/04 | (2006.01) |
| H01L 29/10 | (2006.01) |
| H01L 31/00 | (2006.01) |
| H01L 31/0232 | (2014.01) |
| H01L 21/00 | (2006.01) |
| G01J 5/20 | (2006.01) |
| H01L 27/14 | (2006.01) |
| H01L 35/00 | (2006.01) |
| H01L 35/34 | (2006.01) |
| H01L 35/14 | (2006.01) |
| H01L 35/04 | (2006.01) |
| G01J 5/12 | (2006.01) |
| H01L 27/146 | (2006.01) |
| G01J 5/08 | (2006.01) |
| H01L 35/32 | (2006.01) |

(52) U.S. Cl.
CPC ............... *H01L 35/00* (2013.01); *G01J 5/0853* (2013.01); *G01J 5/12* (2013.01); *H01L 27/14649* (2013.01); *H01L 35/04* (2013.01); *H01L 35/14* (2013.01); *H01L 35/34* (2013.01); *H01L 35/325* (2013.01)

(58) Field of Classification Search
CPC ......... H01L 35/00; H01L 35/04; H01L 35/08; H01L 35/34; H01L 35/32; H01L 35/325; H01L 27/14649; G01J 5/12; G01J 5/0853
USPC ............ 257/53, 467, 436, E29.347, E27.008; 438/54, 57; 250/338.4; 374/E7.004
See application file for complete search history.

(56) References Cited

U.S. PATENT DOCUMENTS

| | | | | |
|---|---|---|---|---|
| 6,031,231 A * | 2/2000 | Kimata et al. | ................. | 250/332 |
| 6,465,784 B1 * | 10/2002 | Kimata | ......................... | 250/332 |
| 8,552,380 B1 * | 10/2013 | Florin et al. | ............... | 250/338.4 |
| 2012/0061569 A1 * | 3/2012 | Noguchi | ..................... | 250/338.3 |
| 2012/0097853 A1 * | 4/2012 | Ouvrier-Buffet et al. | .... | 250/349 |

* cited by examiner

*Primary Examiner* — Fernando L Toledo
*Assistant Examiner* — Aaron Gray
(74) *Attorney, Agent, or Firm* — Kevin E. West; Advent, LLP

(57) ABSTRACT

Techniques are described to form an absorption stack proximate to a thermopile sensor. In one or more implementations, a thermopile sensor is formed proximate to a semiconductor wafer. An absorption stack is formed proximate to the semiconductor wafer and includes a first layer, a second layer, and a third layer. The first layer may be a material having absorption and/or reflective characteristics. The second layer may be a material having wave phase shift characteristic characteristics. The third layer may be a material having a reflective characteristic.

19 Claims, 8 Drawing Sheets

FORMATION OF A THERMOPILE SENSOR UTILIZING CMOS FABRICATION TECHNIQUES

BACKGROUND

Thermopile sensors convert thermal energy into electrical energy. These sensors may utilize several thermocouples to generate an output voltage proportional to a local temperature difference (e.g., a temperature gradient). These thermopile sensors may be utilized in the medical industry to measure body temperature, in heat flux sensors, and/or gas burner safety controls.

SUMMARY

Techniques are described to form an absorption stack proximate to a thermopile sensor utilizing a complementary metal-oxide-semiconductor (CMOS) semiconductor process. In one or more implementations, a thermopile sensor is formed proximate to a semiconductor wafer. An absorption stack is formed proximate to the semiconductor wafer and includes a first layer, a second layer, and a third layer. The first layer may be a material having absorption and/or reflective characteristics. The second layer may be a material having wave phase shift characteristic characteristics. The third layer may be a material having a reflective characteristic, which may be proximal to the semiconductor wafer (e.g., silicon substrate) with respect to the first and second layers.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

Thermopile sensors are utilized in a variety of applications. For target temperatures of around thirty-seven degrees Celsius, which is for medical applications, the peak of infrared radiation may be around ten micrometers. Thus, the thermopile sensors may require sensitivity for light occurring within eight micrometer to twelve micrometer wavelength range. In some instances, the thermopile sensors may be extended to detecting light occurring in the fourteen micrometer wavelength range. Additionally, efficiency in absorbing the infrared radiation and generating heat proportional to that infrared radiation may be a parameter that affects the sensitivity of the thermopile sensors.

Therefore, techniques are described to form an absorption stack proximate to a thermopile sensor utilizing complementary metal-oxide-semiconductor (CMOS) technology. In one or more implementations, a thermopile sensor is formed proximate to a semiconductor wafer. An absorption stack is formed proximate to the semiconductor wafer and includes a first layer, a second layer, and a third layer. The first layer may be a material having absorption and/or reflective characteristics. The second layer may be a material having wave phase shift characteristic characteristics. The third layer may be a material having a reflective characteristic, which may be transparent in the eight to fourteen micrometer wavelength range.

In the following discussion, an example semiconductor device is first described. Exemplary procedures are then described that may be employed to fabricate the example semiconductor device.

Example Implementations

Figure 1:
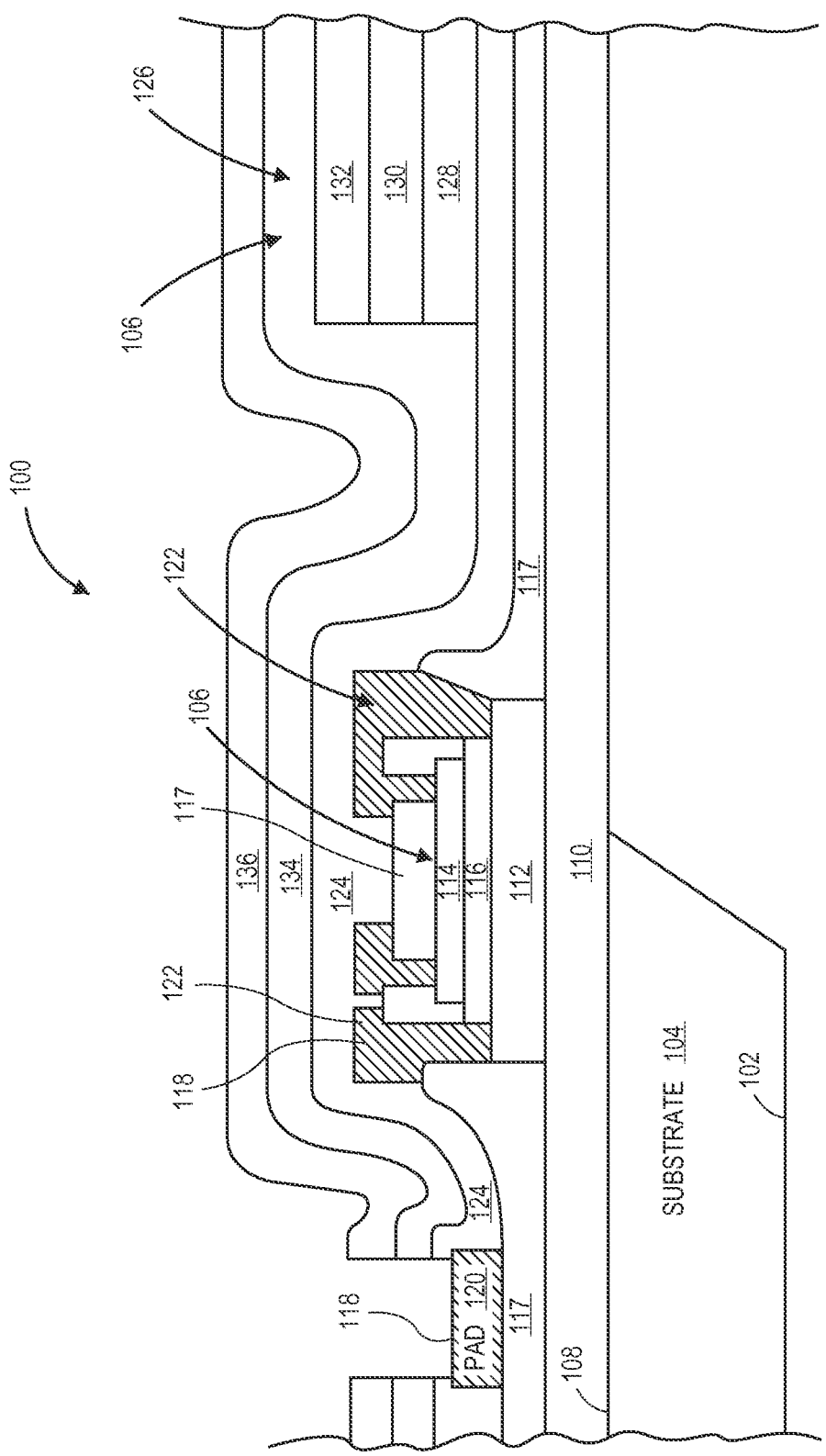
FIG. 1 is a diagrammatic partial cross-sectional side views illustrating a semiconductor device in accordance with an example implementation of the present disclosure.
Figure 2:
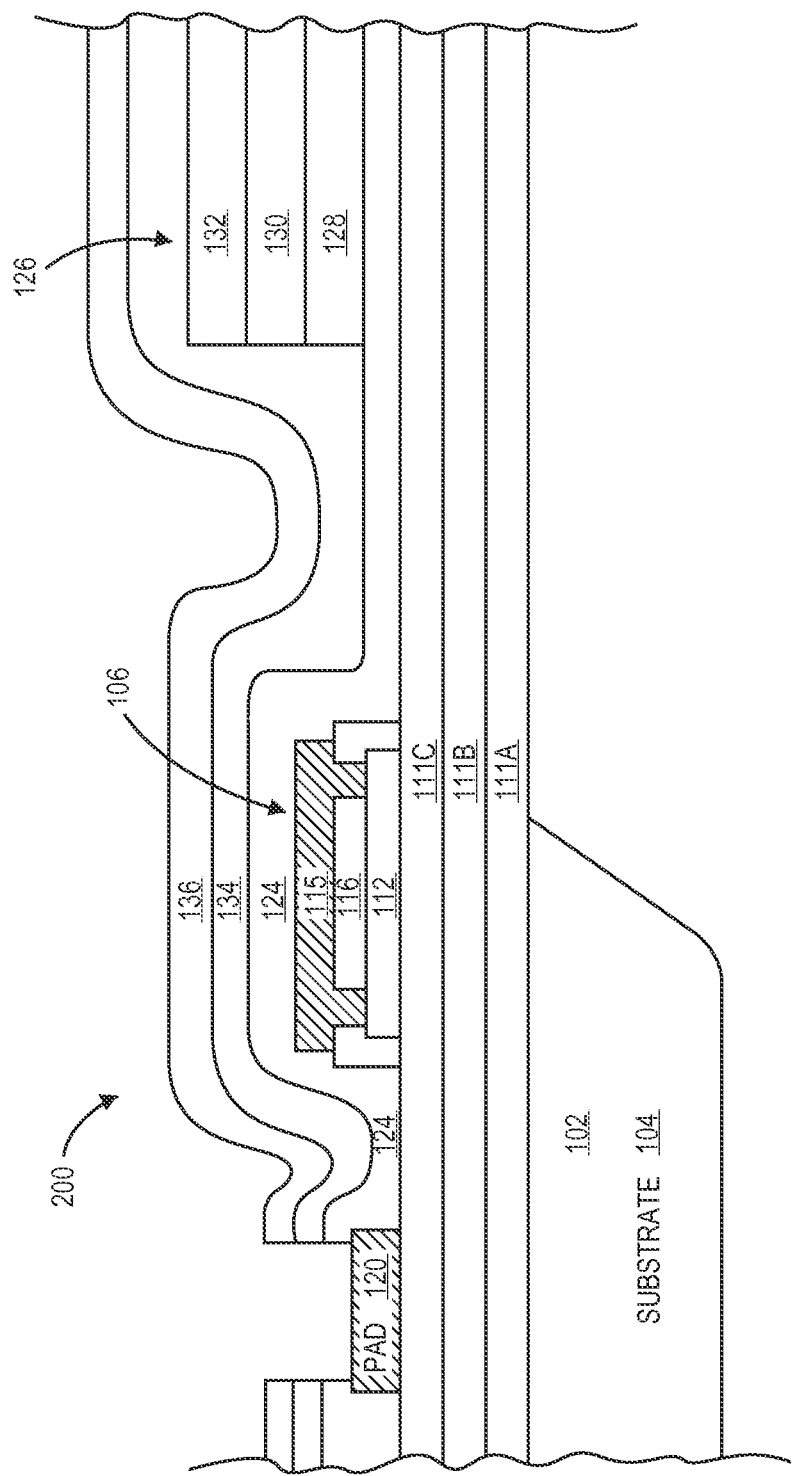
FIG. 2 is diagrammatic partial cross-sectional side views illustrating a semiconductor device in accordance with another example implementation of the present disclosure.

FIGS. 1 and 2 illustrate a cross-sectional view of a semiconductor device 100 and a semiconductor device 200, respectively, in accordance with an example implementation of the present disclosure. As shown, the semiconductor device 100 having one or more silicon regions 102 formed in a substrate 104. In one or more implementations, the semiconductor device 100 comprises a thermopile sensor 106. The thermopile sensor 106 is configured to convert thermal energy into electrical energy. In an implementation, the thermopile sensor 106 generates an output voltage based upon long wavelength infra-red (LWIR) emissions.

The silicon regions 102 may be utilized to create integrated circuit device technology (e.g., complementary metal-oxide-semiconductor (CMOS) technology, microelectromechanical systems (MEMS) technology, etc.). The silicon regions 102 may be configured in a variety of ways. In an implementation, the silicon regions 102 are capable of providing charge carriers to the substrate 104. For example, a silicon region 102 may be comprised of an n-type diffusion region that is capable of providing extra conduction electrons as charge carriers. In another example, a silicon region 102 may be comprised of a p-type diffusion region that is capable of providing extra holes as charge carriers. In another example, a silicon region 102 may comprise an n-type well. In yet another example, a silicon region 102 may comprise a p-type well. The one or more silicon regions 102 are formed proximate to a top surface 108 of the substrate 104.

The substrate 104 comprises a base material utilized to form one or more electronic devices through various fabrication techniques such as photolithography, ion implantation, deposition, etching, and so forth. The substrate 104 may be configured in a variety of ways. In an implementation, the substrate 104 may be at least partially comprised of a silicon wafer. The substrate 104 may comprise an n-type silicon wafer or a p-type silicon wafer. For example, the substrate 104 may comprise a group V element (e.g., phosphorus, arsenic, antimony, etc.) to furnish n-type charge carrier elements to the silicon wafer. In another example, the substrate 104 may comprise a group IIIA element (e.g., boron, etc.) to furnish p-type charge carrier elements to the silicon wafer.

As shown in FIG. 1, the semiconductor device 100 also includes an oxide insulating material 110 (e.g., silicon dioxide ($SiO_2$)) formed over the substrate 104. In some implementations, as shown in FIG. 2, the semiconductor device 100 may include one or more oxide insulating materials 111A, 111B, 111C. For example, the oxide insulating material 111A may comprise a silicon dioxide material, the oxide insulating material 111B may comprise a silicon nitride material, and the oxide insulating material 111C may comprise a silicon dioxide material. The insulating materials 110, 111A, 111B, 111C serve to as a relatively thin membrane structure that is mechanically stable. In some implementations, stress associated with the insulating materials 110, 111A, 111B, 111C is measured and calculated to determine the sizing of the insulating materials 110, 111A, 111B, 111C. The membrane structure provides a thermal conductance between a hot junction (e.g., the absorber stack 126 described herein) and a cold junction (e.g., bulk of the silicon substrate 104), which may result in a higher temperature difference between the absorber stack and the bulk of the silicon substrate when heat is absorbed through electromagnetic radiation (e.g., light) incident upon the respective semiconductor device 100, 200.

Referring back to FIG. 1, a first polysilicon material 112 and a second polysilicon material 114 are formed over the silicon dioxide membrane layer 110. The semiconductor device 100 includes an oxidation layer 116 formed between the first polysilicon material 112 and the second polysilicon material 114 to provide insulation characteristics. The first polysilicon material 112 and the second polysilicon material 114 comprise the thermocouple materials for the thermopile sensor 106. As shown in FIG. 2, the thermopile materials for the semiconductor device 200 may comprise the polysilicon material 112 and a conductive material 115 having the oxidation material 116 formed there between. In this implementation, the polysilicon material 112 and the conductive material 115 comprise the thermocouple materials for the thermopile sensor 106. The conductive material 115 may comprise aluminum, or another suitable conductive material. As shown in FIGS. 1 and 2, an insulating material 117 may be formed over the semiconductor devices 100, 200. In an implementation, the insulating material 117 comprises a borophosphosilicate glass material.

One or more conductive areas 118 are also formed over the substrate 104. For example, the conductive areas 118 comprises a bond pad 120 and interconnects 122 between the first polysilicon material 112 and the second polysilicon material 114 of the semiconductor device 100 or between the polysilicon material 112 and the conductive material 115 of the semiconductor device 200. In an implementation, the conductive material 118 comprises a suitable conductive material for providing electrical interconnectivity characteristics. For example, the conductive material 118 may comprise aluminum, or other suitable materials.

As shown in FIGS. 1 and 2, a passivation layer 124 is formed over the substrate 104. In an implementation, the passivation layer 124 comprises phosphosilicate glass (PSG) material that serves to insulate the various layers for the semiconductor device 100. In a specific implementation, the passivation layer 124 comprises a thickness less than or equal to one hundred nanometers. For instance, the thickness may range from about fifty nanometers to about one hundred nanometers. However, other thicknesses may be utilized in accordance with the design requirements.

The semiconductor device 100, 200 also includes an absorption stack 126. As shown, the absorption stack 126 comprises multiple materials (e.g., layers of materials) as described herein. The absorption stack 126 provides absorption and/or reflective functionality to the thermopile sensor 106. In an implementation, the absorption stack 126 comprises a first layer 128, a second layer 130 (e.g., n-type polysilicon, amorphous silicon, germanium, or the like), and a third layer 132 (e.g., titanium). In various implementations, the first layer 128 comprises a material that provides reflective characteristics. For example, the first layer 128 may comprise an aluminum material having a thickness ranging from about twenty nanometers to about one hundred nanometers. In various implementations, the second layer 130 comprises a long wavelength infra-red (LWIR) material that provides wave phase shift (e.g., quarter wave phase shift) characteristics. For example, the second layer 130 may comprise an n-type poly-silicon material, an amorphous silicon material, or a germanium, and the second layer 130 may have a thickness ranging from about five hundred nanometers to about seven hundred and fifty nanometers. In various implementations, the third layer 132 comprises a material that provides absorption and/or reflective characteristics. For example, the third layer 132 may comprise a titanium material having a thickness ranging from about two nanometers to about five nanometers.

As shown in FIG. 1, the absorber stack 126 also comprises the third layer 134 and/or a fourth layer 136 disposed over the device 100, 200. The third and fourth layers 134, 136 provide absorption and/or reflective characteristics to the device 100, 200. As shown, the third and fourth layers 134, 136 are disposed over the absorption stack 126 and the thermopile sensor 106. In an implementation, the third layer 134 comprises a borophosphosilicate glass (BPSG) material having a thickness of about two hundred and fifty nanometers, and the fourth layer 136 comprises a silicon-nitride material having a thickness of about two hundred and fifty nanometers.

Example Fabrication Processes

Figure 3:
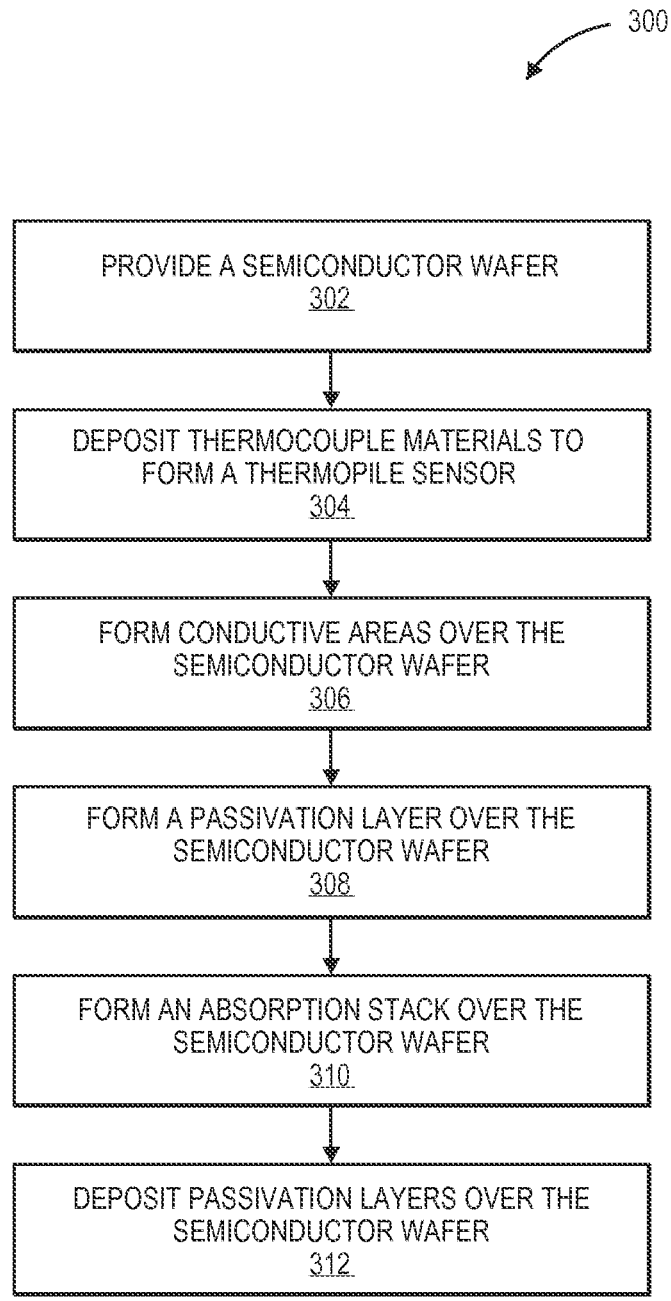
FIG. 3 is a flow diagram illustrating a process in an example implementation for fabricating the semiconductor devices disclosed in the present disclosure.
Figure 4:
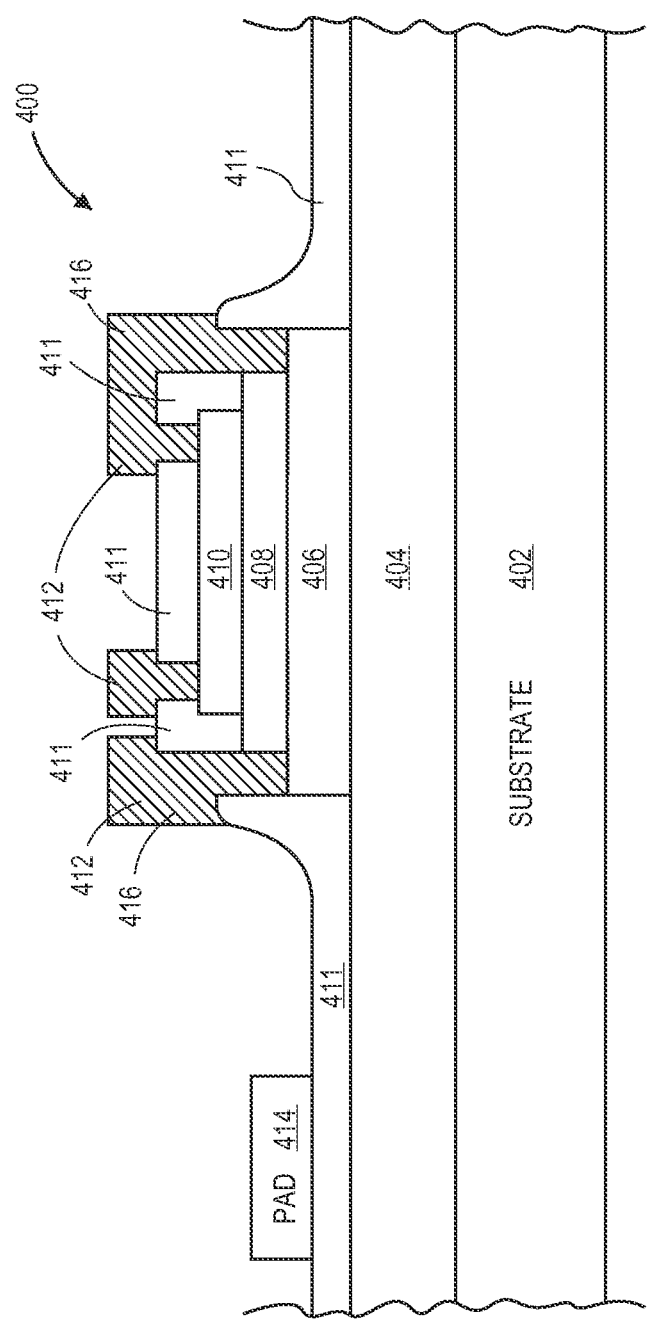
FIG. 4 is a diagrammatic partial cross-sectional side view illustrating a semiconductor device during fabrication in accordance with the present disclosure.

FIG. 3 depicts an example process 300 for fabricating a semiconductor device (e.g., semiconductor device 100, semiconductor device 200) in accordance with the present disclosure. In one or more implementations, the process 300 may utilize suitable complementary metal-oxide-semiconductor (CMOS) semiconductor processing techniques to fabricate the semiconductor device 100 (or semiconductor device 200). A portion of a semiconductor wafer 400 that comprises the substrate 104 is illustrated in FIGS. 4-8. A semiconductor wafer is provided as shown in FIG. 3 (Block 302). In one or more implementations, as shown in FIG. 4, the semiconductor wafer 400 includes a semiconductor substrate 402 having an oxidation layer 404 (e.g., a silicon dioxide membrane). In the process 300 illustrated, thermocouple materials are deposited to form a thermopile sensor (Block 304). A first polysilicon layer 406, an oxidation layer 408, and a second polysilicon layer 410 are deposited and etched to define the thermocouple materials that comprise the thermopile sensor. Various passivation layers 411, such as BPSG materials, may be deposited and selectively etched over and about the thermopile materials. In another implementation, the thermopile materials may comprise the polysilicon layer, a conductive layer (such as aluminum), and an oxidation layer at least partially formed there between as described above with respect to FIG. 2.

Figure 5:
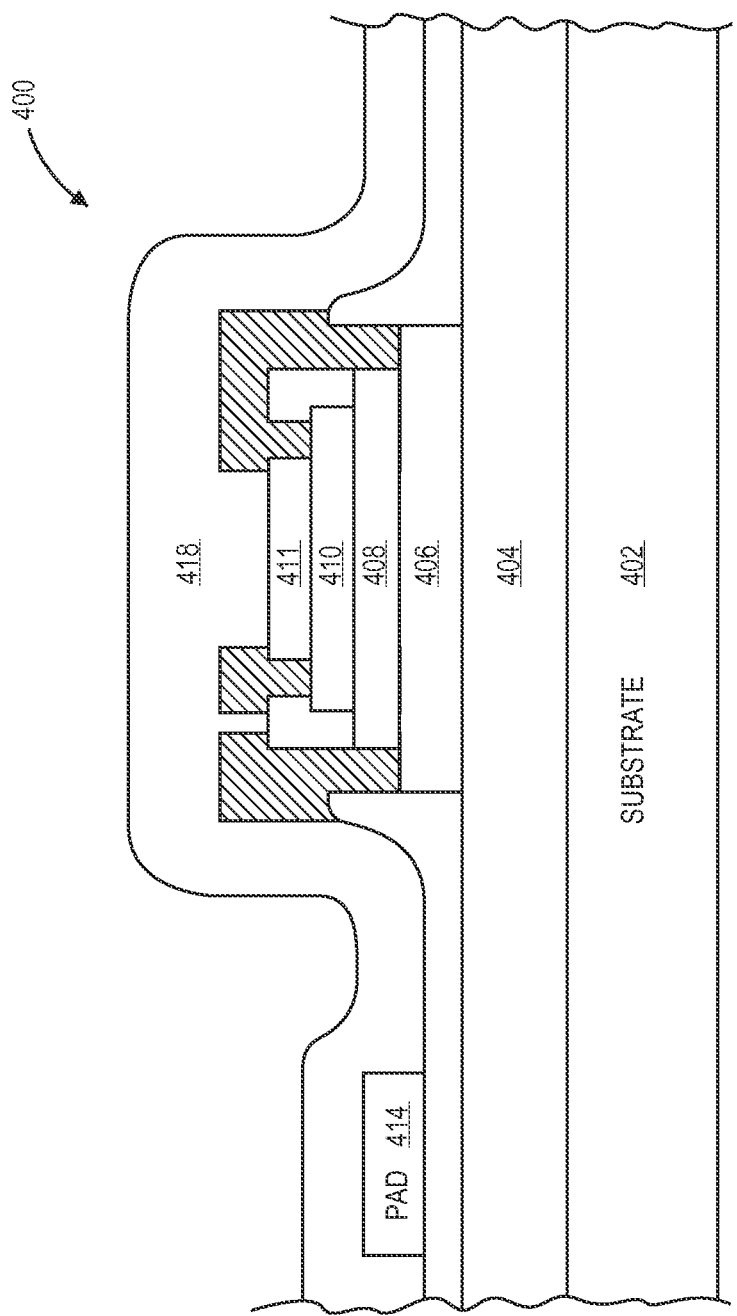
FIG. 5 is another partial cross-sectional side view illustrating a semiconductor device during fabrication in accordance with the present disclosure.

Conductive areas are formed over the semiconductor wafer (Block 306). For example, one or more conductive materials 412 are deposited over the semiconductor wafer 400 and selectively etched to form bond pads 414 and interconnects 416. A passivation layer is formed over the semiconductor wafer (Block 308). In an implementation, as shown in FIG. 5, a passivation layer 418, such as a PSG material, is deposited over the semiconductor wafer 400.

Figure 6:
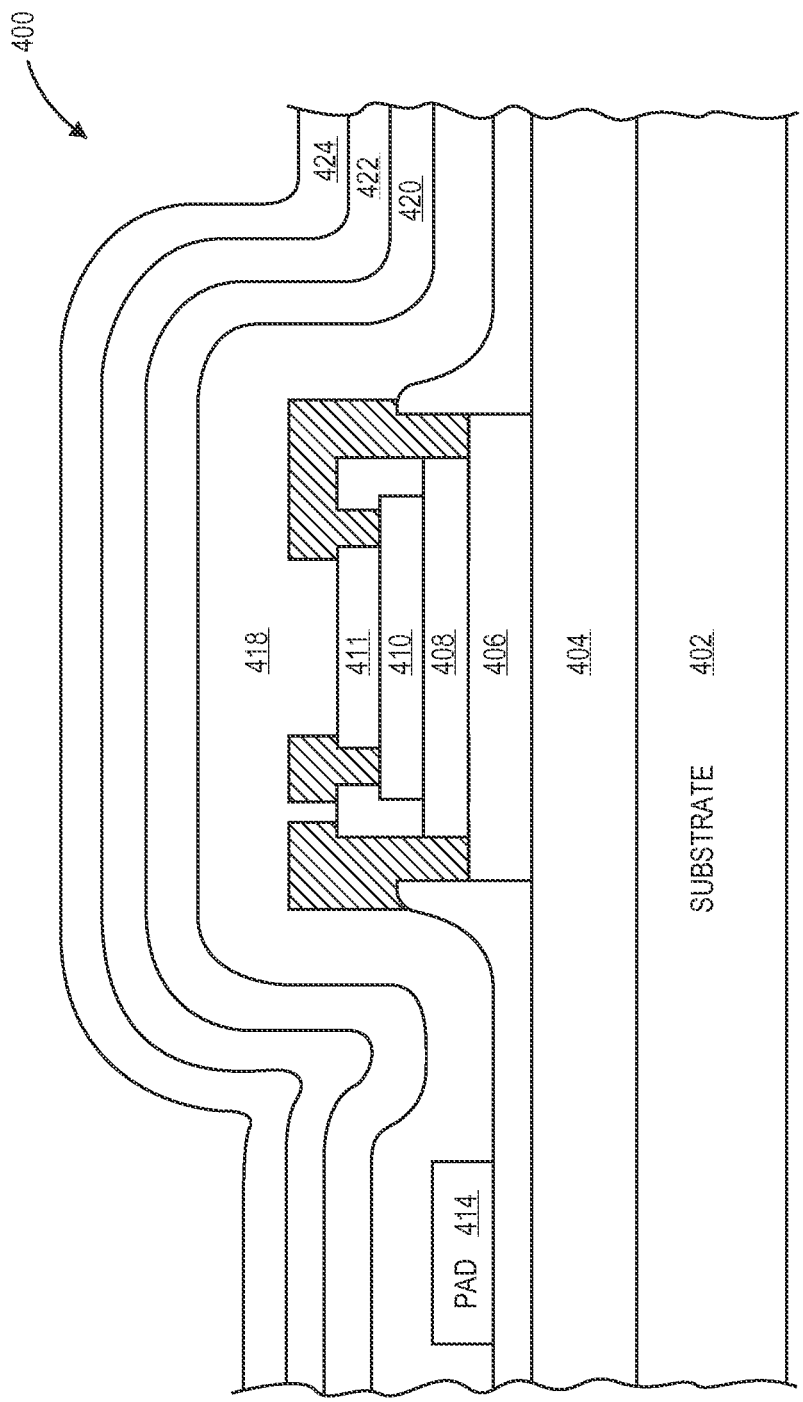
FIG. 6 is another partial cross-sectional side view illustrating a semiconductor device during fabrication in accordance with the present disclosure.
Figure 7:
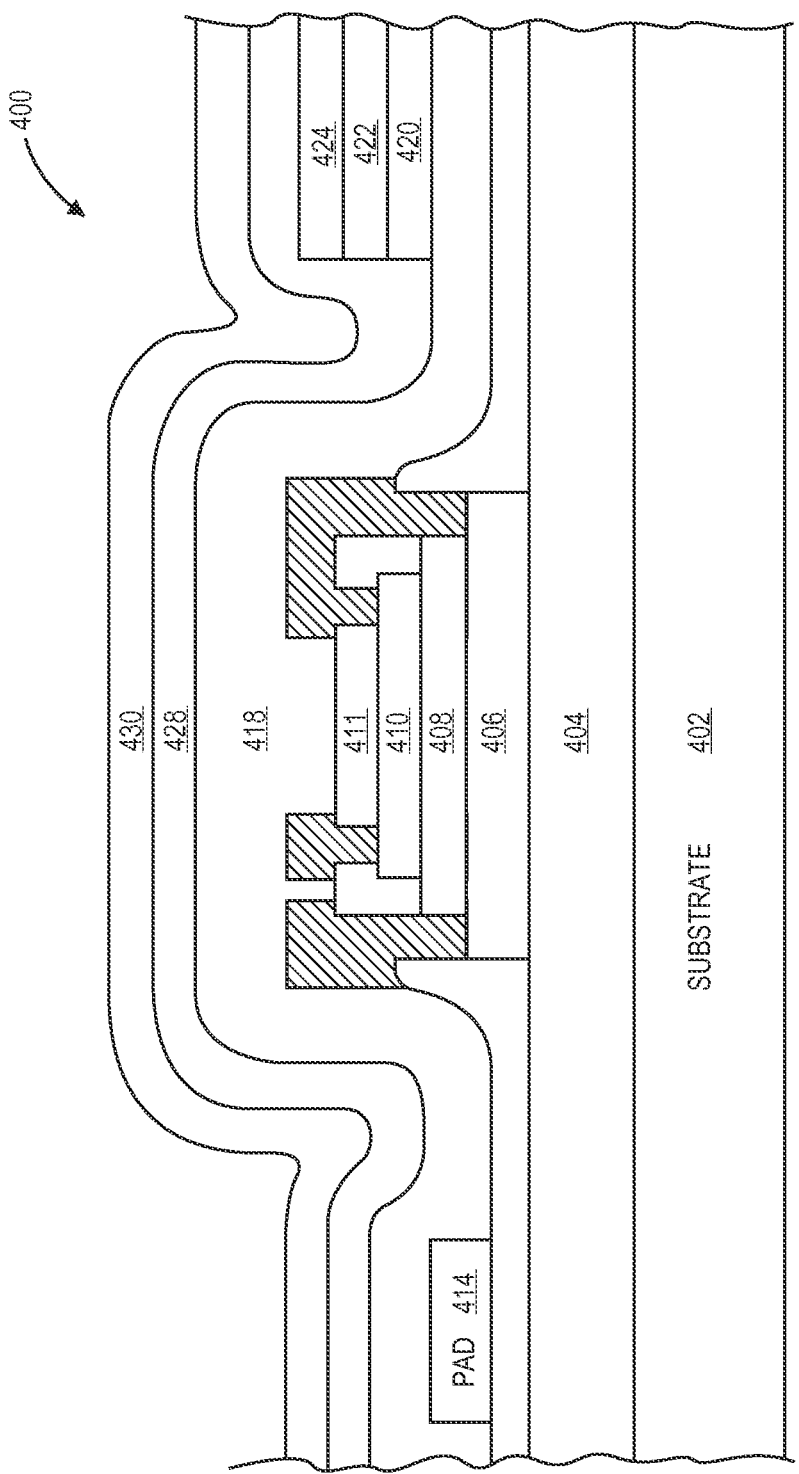
FIG. 7 is another partial cross-sectional side view illustrating a semiconductor device during fabrication in accordance with the present disclosure.
Figure 8:
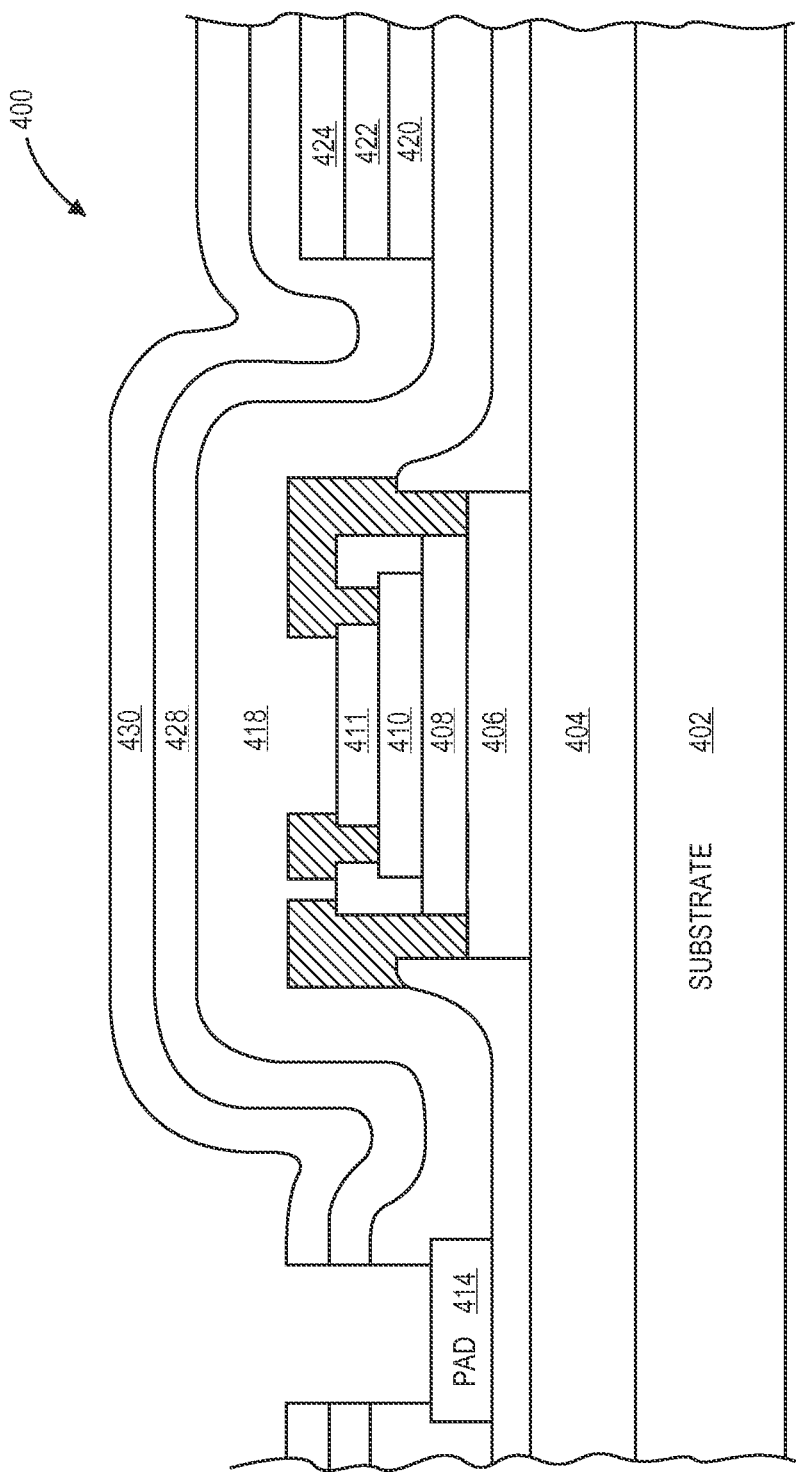
FIG. 8 is another partial cross-sectional side view illustrating a semiconductor device during fabrication in accordance with the present disclosure.

As shown in FIG. 3, an absorption stack is formed (Block 310). As described above, the absorption stack may comprise multiple layers for providing absorption and/or reflective characteristics for thermopile sensing. In an implementation, a first layer 420 (e.g., an aluminum layer), a second layer 422 (e.g., a polysilicon layer, an amorphous silicon layer, or a germanium), and a third layer 424 (e.g., titanium) are deposited over the semiconductor wafer 400 as shown in FIG. 6. The layers 420, 422, 424 may then be selectively etched utilizing suitable etching techniques to define the absorption stack 426. One or more passivation layers are deposited over the semiconductor wafer (Block 312). In one or more implementations, as shown in FIG. 7, a first passivation layer 428 (e.g., BPSG materials) and a second passivation layer 430 (silicon-nitride materials) are deposited over the semiconductor wafer 400. The passivation layers 428, 430 serve to increase an absorption characteristic of the absorption stack 426 (e.g., the absorption stack 426 absorbs a greater amount of light incident upon the absorption stack 426 compared to an absorption stack that does not include the passivation layers 428, 430). The various layers formed over the semiconductor wafer 400 may then be selectively etched to expose the bond pads 414 (see FIG. 8). Suitable backside processing techniques may be utilized to finalize the semiconductor devices 100, 200. For example, as shown in FIGS. 1 and 2, a portion of the semiconductor substrate 104 may be at least partially removed to expose the insulating material 110 (e.g., the silicon dioxide membrane), or the like.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A process comprising:
   forming a thermopile sensor proximate to a semiconductor wafer, the thermopile sensor comprising at least a first thermocouple material and a second thermocouple material; and
   forming an absorption stack proximate to the semiconductor wafer, the absorption stack comprising a first planar layer having at least one of an absorption characteristic or a reflective characteristic, a second planar layer having a wave phase shift characteristic, the second planar layer different from the first planar layer, and a third planar layer having a reflective characteristic, the third planar layer different from the first planar layer and the second planar layer, the first planar layer, the second planar layer, and the third planar layer arranged in a stacked configuration, wherein the absorption stack is horizontally offset with respect to the thermopile sensor.

2. The process as recited in claim 1, wherein the first planar layer comprises a titanium material, the second planar layer comprises at least one of a polysilicon material, an amorphous silicon material, or a germanium material, and the third planar layer comprises aluminum.

3. The process as recited in claim 1, wherein an oxide layer is disposed over the third planar layer.

4. The process as recited in claim 1, wherein the first planar layer has a thickness ranging from about three nanometers to about five nanometers, the second planar layer has a thickness ranging from about six hundred nanometers to about seven hundred and fifty nanometers, and the third planar layer has a thickness ranging from about twenty nanometers to about fifty nanometers.

5. The process as recited in claim 1, forming a first passivation layer over the thermopile sensor.

6. The process as recited in claim 5, wherein the first passivation layer comprises a phosphosilicate glass (PSG) material.

7. The process as recited in claim 5, wherein a thickness of the first passivation layer ranges from about fifty nanometers to about one hundred nanometers.

8. The process as recited in claim 5, further comprising forming a second passivation layer and a third passivation layer over the absorption stack.

9. The process as recited in claim 8, wherein the second passivation layer comprises a silicon-nitride material, and the third passivation layer comprises a borophosphosilicate glass material.

10. A semiconductor device comprising:
    a semiconductor substrate;
    a thermopile sensor disposed proximate the semiconductor substrate, the thermopile sensor comprising at least a first thermocouple material and a second thermocouple material;
    an absorption stack disposed proximate to the semiconductor substrate, the absorption stack comprising a first planar layer having at least one of an absorption characteristic or a reflective characteristic, a second planar layer having a wave phase shift characteristic, the second planar layer different from the first planar layer, and a third layer having a reflective characteristic, the third planar layer different from the first planar layer and the second planar layer, the first planar layer, the second planar layer, and the third planar layer arranged in a stacked configuration, wherein the absorption stack is horizontally offset with respect to the thermopile sensor; and
    at least one passivation layer disposed proximate to the semiconductor wafer, the at least one passivation layer disposed over the absorption stack.

11. The semiconductor device as recited in claim 10, wherein the first planar layer comprises a titanium material, the second planar layer comprises at least one of a polysilicon material, an amorphous silicon material, or a germanium material, and the third planar layer comprises aluminum.

12. The semiconductor device as recited in claim 10, further comprising an oxide layer is disposed over the third planar layer.

13. The semiconductor device as recited in claim 10, wherein the first planar layer has a thickness ranging from about three nanometers to about five nanometers, the second planar layer has a thickness ranging from about six hundred nanometers to about seven hundred and fifty nanometers, and the third planar layer has a thickness ranging from about twenty nanometers to about fifty nanometers.

14. The semiconductor device as recited in claim 10, wherein the at least one passivation layer comprises a first passivation layer and a second passivation layer.

15. The semiconductor device as recited in claim 14, wherein the first passivation layer comprises a silicon-nitride material, and the second passivation layer comprises a borophosphosilicate glass material.

16. The semiconductor device as recited in claim 15, wherein the first passivation layer and the second passivation layer increases an absorption characteristic of the absorption stack.

17. A semiconductor device comprising:
   a semiconductor substrate;
   a thermopile sensor disposed proximate the semiconductor substrate, the thermopile sensor comprising at least a first thermocouple material and a second thermocouple material;
   an absorption stack disposed proximate to the semiconductor substrate, the absorption stack comprising a first planar layer having at least one of an absorption characteristic or a reflective characteristic, a second planar layer having a wave phase shift characteristic, the second planar layer different from the first planar layer, and a third planar layer having a reflective characteristic, the third planar layer different from the first planar layer and the second planar layer, the first planar layer, the second planar layer, and the third planar layer arranged in a stacked configuration, wherein the absorption stack is horizontally offset with respect to the thermopile sensor;
   a first passivation layer disposed proximate to the semiconductor wafer, the first passivation layer disposed over the absorption stack;
   a second passivation layer disposed proximate to the semiconductor wafer, the second passivation layer disposed over the first passivation layer; and
   a third passivation layer disposed proximate to the semiconductor wafer, at least a portion of the third passivation layer disposed over the thermopile sensor and the absorption stack is formed directly over the third passivation layer, wherein the first passivation layer and the second passivation layer are disposed over the third passivation layer.

18. The semiconductor device as recited in claim 17, wherein the first planar layer comprises a titanium material, the second planar layer comprises at least one of a polysilicon material, an amorphous silicon material, or a germanium material, and the third planar layer comprises aluminum.

19. The semiconductor device as recited in claim 17, wherein the first passivation layer comprises a silicon-nitride material, and the second passivation layer comprises a borophosphosilicate glass material.

\* \* \* \* \*